US006949935B1

(12) United States Patent
Stenger et al.

(10) Patent No.: US 6,949,935 B1
(45) Date of Patent: Sep. 27, 2005

(54) METHOD AND SYSTEM FOR BUILT IN TESTING OF SWITCH FUNCTIONALITY OF TUNABLE CAPACITOR ARRAYS

(75) Inventors: Joseph D. Stenger, North Plains, OR (US); Brent R. Jensen, Portland, OR (US)

(73) Assignee: Cypress Semiconductor Corp., San Jose, CA (US)

(*) Notice: Subject to any disclaimer, the term of this patent is extended or adjusted under 35 U.S.C. 154(b) by 91 days.

(21) Appl. No.: 10/286,086

(22) Filed: Nov. 1, 2002

(51) Int. Cl.[7] ............... G01R 31/12; G01R 31/02
(52) U.S. Cl. .................... 324/548; 324/158.1
(58) Field of Search ............... 324/548, 519, 324/76.28, 76.68, 678, 677, 158.1; 327/554, 327/365, 337; 714/724, 733–734

(56) References Cited

U.S. PATENT DOCUMENTS 5,276,446 A * 1/1994 Sellars ................. 341/118
5,581,563 A * 12/1996 Penza et al. ............ 714/724

* cited by examiner

Primary Examiner—Vincent Q. Nguyen
Assistant Examiner—Amy He
(74) Attorney, Agent, or Firm—Wagner, Murabito & Hao LLP

(57) ABSTRACT

A system and method of testing switch functionality of a tunable capacitor array is disclosed. A built in test (BIT) circuit provides digital device for testing the functionality of a programmable switch capacitor array circuit. The method and system provides for switching a capacitor switch of a switch capacitor array between on and off, switching a test enable switch of a BIT circuit between on and off, pulling an internal node of the BIT circuit either high or low using a current source, and determining whether the internal node has been pulled either high or low. In addition, the method and system provides for making a pass or fail determination based on a determined state of the internal node.

22 Claims, 14 Drawing Sheets

|  | CTE | FT | C<n> |  |
|---|---|---|---|---|
| 500A | | | * | HIGH |
| | * | * | | LOW |

|  | T | MB1 |  |
|---|---|---|---|
| 500B | LOW | ON | FAIL |
| | HIGH | OFF | PASS |

FIGURE 5B

|  | CTE | FT | C<n> |  |
|---|---|---|---|---|
| 600A | * |  | * | HIGH |
|  |  | * |  | LOW |

|  | T | MO |  |
|---|---|---|---|
| 600B | HIGH | OFF | PASS |
|  | LOW | ON | FAIL |

FIGURE 6B

|       | CTE | FT | C<n> |      |
|-------|-----|----|------|------|
| 700A  | *   | *  | *    | HIGH |
|       |     |    |      | LOW  |

|       | T    | MO  |      |
|-------|------|-----|------|
| 700B  | HIGH | ON  | PASS |
|       | LOW  | OFF | FAIL |

| CTE | FT | C<n> | |
|---|---|---|---|
|  | * | * | HIGH |
| * |  | * | LOW |

800B

| T | MB1 | |
|---|---|---|
| HIGH | ON | FAIL |
| LOW | OFF | PASS |

FIGURE 8B

METHOD AND SYSTEM FOR BUILT IN TESTING OF SWITCH FUNCTIONALITY OF TUNABLE CAPACITOR ARRAYS

TECHNICAL FIELD

The present invention relates generally to tunable capacitor arrays. In particular, an embodiment of the present invention relates to a method and system for built in testing of the functionality of switches in tunable capacitor arrays.

BACKGROUND ART

Capacitor arrays are groups of parallel capacitors that form a single capacitance. Tunable capacitor arrays can comprise a base capacitor and binary weighted capacitors connected in parallel with the base capacitor. In typical applications, the Most Significant Bit (MSB) is a percentage of the base capacitor, and each lower bit is 50% of the previous bit. In many integrated circuit applications, the RC time constant of a circuit may need to be tuned to make corrections for process variation in typical value and temperature coefficients. Switchable binary capacitors can facilitate this tuning by allowing adjustments to the value of the circuit RC time constant. The capacitor values may be adjusted by enabling or disabling a switch in series with a portion of the total capacitance. Typically, the switches that are a part of such arrangements include MOSFET devices that are connected in series with the top plate of the capacitor. These switches can be turned on or off to add or remove parallel capacitance, and are controlled by digital registers in the logic control section of the circuit.

FIG. 1 is a diagram of a circuit having a typical integrator architecture. Capacitors Cbase and C0-Cn form a capacitor array, and switches M0 and Mn may be turned on or off to add or remove parallel capacitance to or from the array as described above. As is conventional, operational amplifier 101 receives an input signal through resistor R1 via input terminal Vi, and produces an output signal at output terminal Vo.

One analog method of testing the functionality of switches and control logic of binary tunable capacitors is to observe the step response of the circuit. According to this method, an integrator circuit, possessing a binary tunable capacitor (such as that shown in FIG. 1), is stimulated with a step input function. The step output response is then analyzed for information pertaining to aspects of the functionality of the tunable capacitors. As additional capacitance is added to the integrator, the rise time of the step response becomes slower. And, if the size of each capacitor added is sufficiently large, the change in rise time will be clearly evident and entirely measurable. However, if the size of the capacitor added is sufficiently small, the rise time change may be masked by other circuit phenomena and may not be measurable with sufficient resolution. Consequently, the rise time change may not be distinguishable so as to provide useful information. Another drawback of such methods, is that such tests only work for simple integrators. If the integrator configuration is complex, additional test circuitry is needed to configure it appropriately which is time consuming.

Another method entails measuring the bandwidth and center frequency of each device for every capacitor configuration code of the array. However, measuring the bandwidth and center frequency of each device, for every capacitor configuration code of the array, is time consuming. Moreover, circuit faults are not guaranteed to be found if they do not operate to dramatically alter circuit characteristics. As with other conventional testing methods, this method requires the use of complex and expensive analog testing equipment.

SUMMARY OF THE INVENTION

Accordingly, a need exists for a method and system for providing efficient built in testing of switch functionality of switched capacitor arrays. The present invention provides a method and system that accomplishes this need.

For instance, one embodiment of the present invention provides a method and system for switching a capacitor switch of a switch capacitor array between on and off, switching a test enable switch of a built in testing (BIT) circuit between on and off, pulling an internal node of the BIT circuit either high or low using a current source, and determining whether the internal node has been pulled either high or low. In addition, the method and system provides for making a pass or fail determination based on a determined state of the internal node.

In one embodiment, the BIT circuit, pull up current source, pull down current source, and a controllable switch enable the direct testing of the switches that enable the capacitors of the switched array. Testing can be accomplished using a JTAG port or any other suitable digital interface (firewire, SPI, etc.) in one embodiment.

Using the BIT (built in test) circuitry of the present invention, a programmable switch capacitor array circuit can be digitally tested where the individual switches of the programmable array can be directly tested.

In yet another embodiment, the present invention includes a computer-usable medium having computer-readable code embodied therein for causing a computer to perform particular actions as described above to provide built in testing of the switch functionality of switched capacitor arrays.

These and other advantages of the present invention are discussed in the following detailed description of the preferred embodiments which are illustrated in the drawing figures.

BRIEF DESCRIPTION OF THE DRAWINGS

The accompanying drawings, which are incorporated in and form a part of this specification, illustrate an embodiment of the invention and, together with the description, serve to explain the principles of the invention:

FIG. 5B shows charts displaying the test results corresponding to particular switch dispositions in a circuit configured in accordance with the process of FIG. 5A.

FIG. 6B shows charts displaying the test results corresponding to particular switch dispositions in a circuit configured in accordance with the process of FIG. 6A.

FIG. 7B shows charts displaying the test results corresponding to particular switch dispositions in a circuit configured in accordance with the process of FIG. 7A.

FIG. 8B shows charts displaying the test results corresponding to particular switch dispositions in a circuit configured in accordance with the process of FIG. 8A.

DETAILED DESCRIPTION OF THE INVENTION

Figure 1:
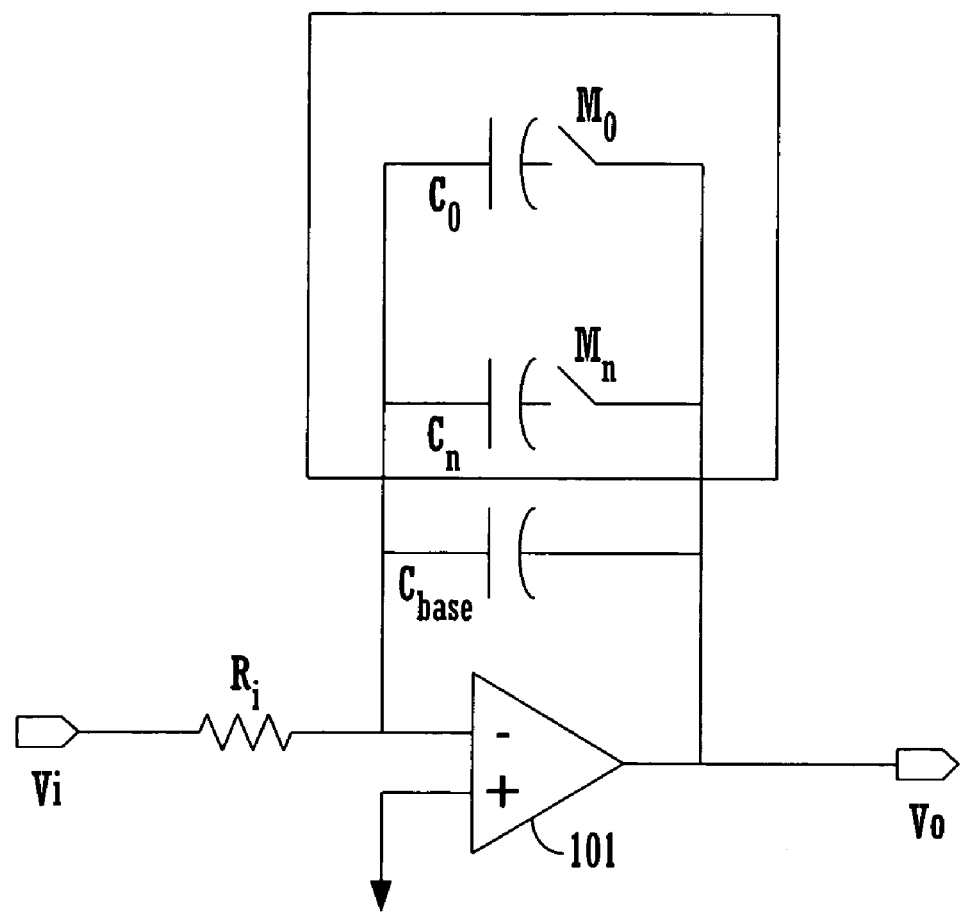
FIG. 1 is a diagram of a circuit having a conventional integrator architecture.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Notation and Nomenclature

Some portions of the detailed descriptions which follow are presented in terms of test procedures, logic blocks, processing, and other symbolic representations of operations on data bits within a computer system or electronic computing device. These descriptions and representations are the means used by those skilled in the data processing arts to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Usually, though not necessarily, these physical manipulations take the form of electrical or magnetic signals capable of being stored, transferred, combined, compared, and otherwise manipulated in a computer system or similar electronic computing device. For reasons of convenience, and with reference to common usage, these signals are referred to as bits, values, elements, symbols, characters, terms, numbers, or the like with reference to the present invention.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussions, it is understood that throughout discussions of the present invention, discussions utilizing terms such as "determining" or "examining" or "verifying" or "setting" or the like, refer to the action and processes of a computer system, or similar electronic computing device, that manipulates and transforms data. For example, the data is represented as physical (electronic) quantities within the computer system's registers and memories and is transformed into other data similarly represented as physical quantities within the computer system memories or registers or other such information storage, transmission, or display devices.

Built in Testing of Switch Functionality in Switched Capacitor Arrays

The method and system of the present invention, in one embodiment, provides a built in test (BIT) to efficiently test the functionality of the switches and the control logic of a binary tunable capacitor. According to one embodiment, the invention also provides for examining whether or not the terminals of the tunable capacitor are DC shorted. According to one embodiment, the test employs the use of a strong current source/weak current source circuit for making closed switch verification, and a weak current source/open circuit mechanism for making open switch verification as is described herein with reference to FIGS. 5A–8A.

Advantages of the present invention include simplicity of design in that a minimal amount of circuitry may be needed for implementation. According to one embodiment, in addition to an operational amplifier integrator (see discussion below), a switch, a pmos pullup transistor, an nmos pulldown transistor, and a CMOS translator may be needed. It should be appreciated that, according to exemplary embodiments, adding this testing circuitry may not degrade the normal operation of the operational amplifier integrator. Another advantage of the present invention is that additional DC current may not be needed during the normal operation of the circuit. Also, the inexpensive built in digital tester employed reduces production time and test costs.

A feature of one embodiment of the present invention, is that access to the testing circuitry may be gained by means that include but are not limited to JTAG port, and other digital interfaces. In addition, it should be appreciated that the discussion of the operation of the invention herein will refer to a single test circuit (see FIG. 3 described herein). However, any number of switchable capacitors could be tested simultaneously, or in groups if the scaling of the output currents of the operational amplifiers becomes unreasonable.

Figure 2:
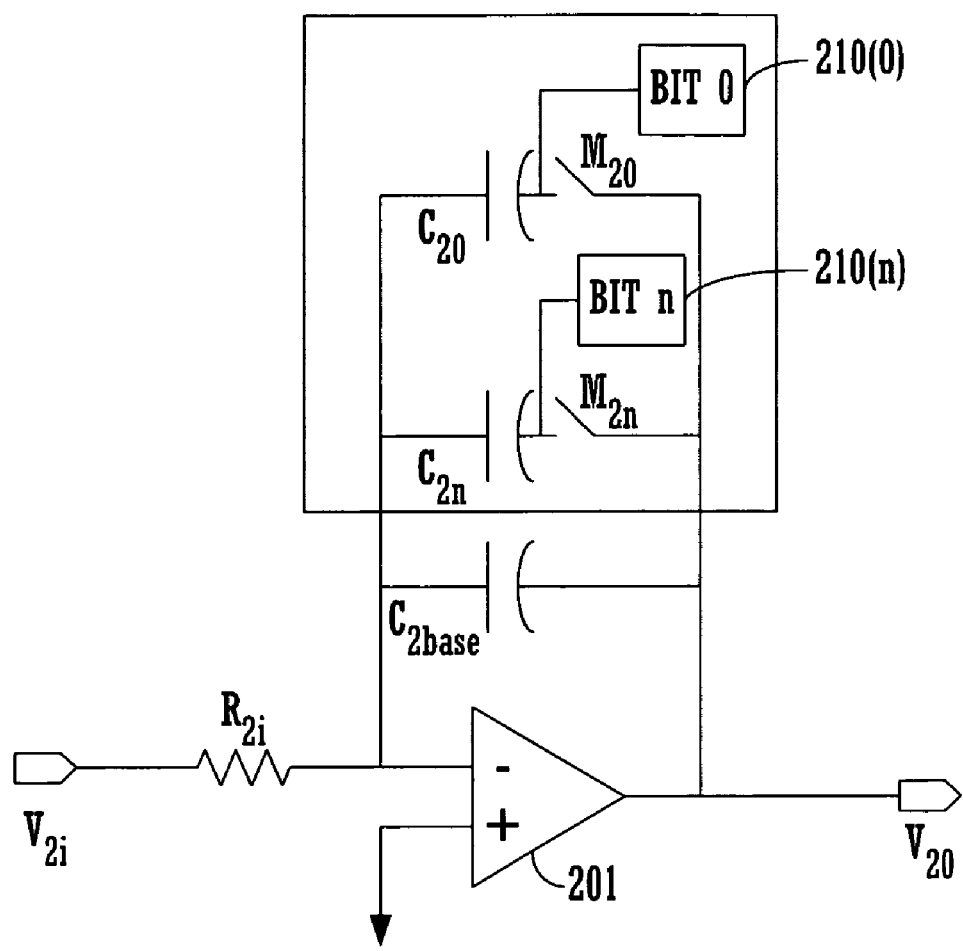
FIG. 2 is a diagram of an operational amplifier integrator with a BIT (built in testing) circuit configured in accordance with one embodiment of the present invention.

FIG. 2 is a diagram of an operational amplifier integrator with a BIT circuit configured in accordance with the present invention. Referring to FIG. 2, discrete capacitors C2base and C20–C2$n$ form a capacitor array, and switches M20 and M2$n$ may be turned on or off to add or remove parallel capacitance to or from the array as described above. In accordance with this embodiment, bit circuits Bit0-BitN, 210(0)-210($n$), test the functionality of the switches M20–M2$n$ and the control logic of the capacitor array. The BIT circuits 210(0)-210($n$) also examine whether the terminals of the capacitor are DC shorted. According to one embodiment of the present invention, the test circuitry may be placed in several different modes and the test result for each mode may be read from a single digital output bit. Also shown in FIG. 2 is operational amplifier 201, resistor R2i, input terminal V2i, and output terminal V2o.

In an alternate embodiment, switches may be placed on either side of the capacitor, either in series with the top or the bottom plate. Moreover, according to one embodiment, the invention can be extended for use with multiple operational amplifiers. Such configurations may utilize either single ended or differential operational amplifiers. According to one embodiment, the system can work with differentiating arrangements as well as with the integrating arrangement described herein. In an alternate embodiment, an operational amplifier may not be required.

Figure 3A:
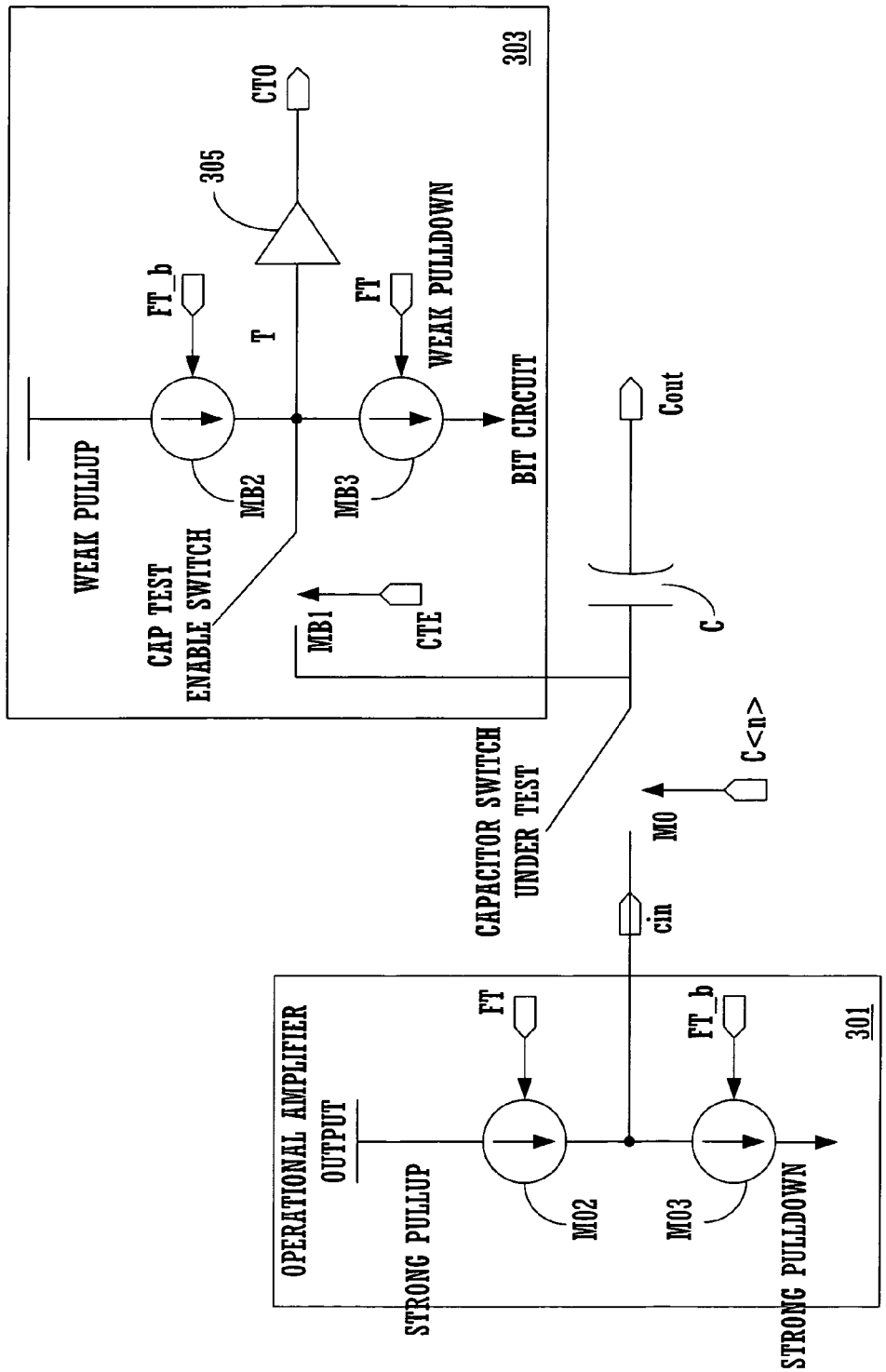
FIG. 3A is a diagram of an operational amplifier integrator with a BIT circuit configured in accordance with one embodiment of the present invention.

Exemplary Circuit Network in Accordance with Embodiments of the Present Invention FIG. 3A is a schematic of capacitor switch BIT (built in testing) circuitry employed in a capacitor array. FIG. 3A shows capacitor array switch M0, capacitor C, capacitor control bit C<n>, capacitor output Cout, capacitor input Cin, strong pullup current source MO2, strong pulldown current source MO3, fault type selects FT and FT_b (inverse of FT), capacitor test enable switch MB1, capacitor test enable CTE, weak pullup current source MB2, weak pulldown current source MB3, internal node T, operational amplifier output 301, BIT (built in testing) circuit 303, and buffer 305.

According to one embodiment of the present invention, switch functionality of switches in a switch capacitor array may be tested by turning a capacitor array switch M0 of a switch capacitor array "on" or "off" and turning a test enable switch MB1 of a BIT circuit 303 "on" or "off" and consequently pulling an internal node T of the BIT circuit either high or low using a current source (e.g., MO2, MO3, MB2, and MB3). The current source may be located in either the operational amplifier output circuit 301 or the BIT circuit 303. According to one embodiment, it is determined if internal node T has in fact been pulled high or low. A pass or fail evaluation is made based on whether the internal node has in fact been found to be pulled high or low and whether the switch being tested is "on" or "off".

According to exemplary embodiments, capacitor array switch M0 is activated (turned "on") with capacitor control bit C<n>, while capacitor test enable switch MB1 is activated by capacitor test enable CTE. Fault type selects FT and FT_b, activate the current sources (MO2, MO3, MB2 and MB3). While Cin and Cout represent the input and output terminals respectively of the capacitor C of capacitor array switch M0. Pass/Fail results of the testing process are taken from the capacitor test output terminal CTO.

Figure 3B:
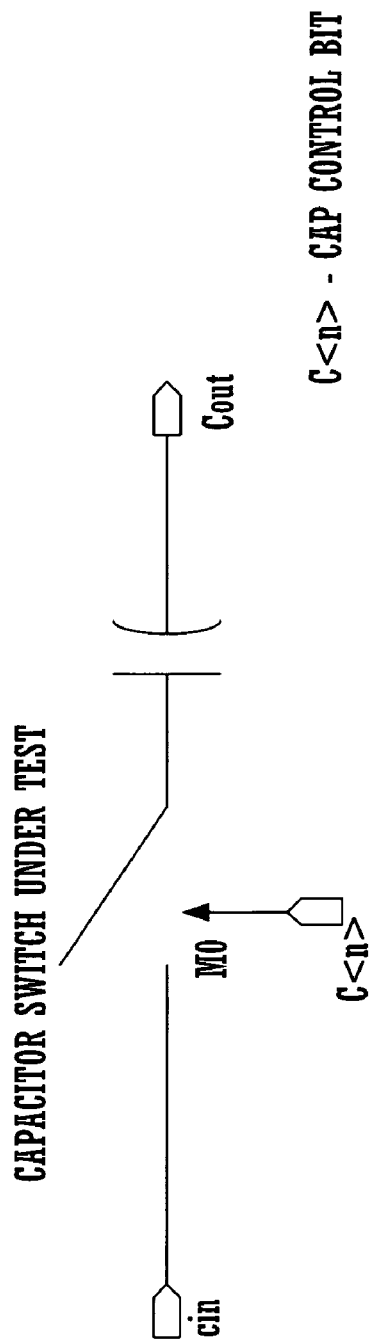
FIG. 3B shows a capacitor switch such as is shown in FIG. 3A.

According to one embodiment, the integrity of capacitor C may be tested by measuring the signal level at its output terminal Cout. From the signal level measured at output terminal Cout, assessments may be made that include but are not limited to whether the capacitor C is shorted. It should be appreciated that other configurations of the circuit arrangement shown in FIG. 3A may be employed according to one embodiment of the present invention. According to alternate embodiments, the strong pullup or the strong pulldown current source could be employed in the BIT circuit and the weak pullup or weak pull down current sources can be employed in the operational amplifier circuit. In these embodiments as in the embodiment shown in FIG. 3A, an internal node is pulled either high or low using the aforementioned current sources, and a pass fail determination based on a determined state of the internal node is made; FIG. 3B shows an isolated illustration of the capacitor switch shown in FIG. 3A.

Exemplary Operations in Accordance with Embodiments of the Present Invention

FIGS. 4, and 5A–8A are flowcharts of steps executed in a process for testing switch functionality in a switched capacitor array, using the BIT (built in test) circuits of FIGS. 2–3b. The flowcharts include processes of the present invention which, in one embodiment, are carried out by processors and electrical components under the control of computer readable and computer executable instructions. The computer readable and computer executable instructions reside, for example, in data storage features such as computer usable volatile memory and/or computer usable non-volatile memory (e.g. 904 and 906 described herein with reference to FIG. 9). However, the computer readable and computer executable instructions may reside in any type of computer readable medium. Although specific steps are disclosed in the flowcharts, such steps are exemplary. That is, the present invention is well suited to performing various other steps or variations of the steps recited in the flowcharts. Within the present embodiment, it should be appreciated that the steps of the flowcharts may be performed by software, by hardware or by a combination of both. It should be noted that the following flowcharts are discussed with reference to elements of FIG. 3A described herein.

Figure 4:
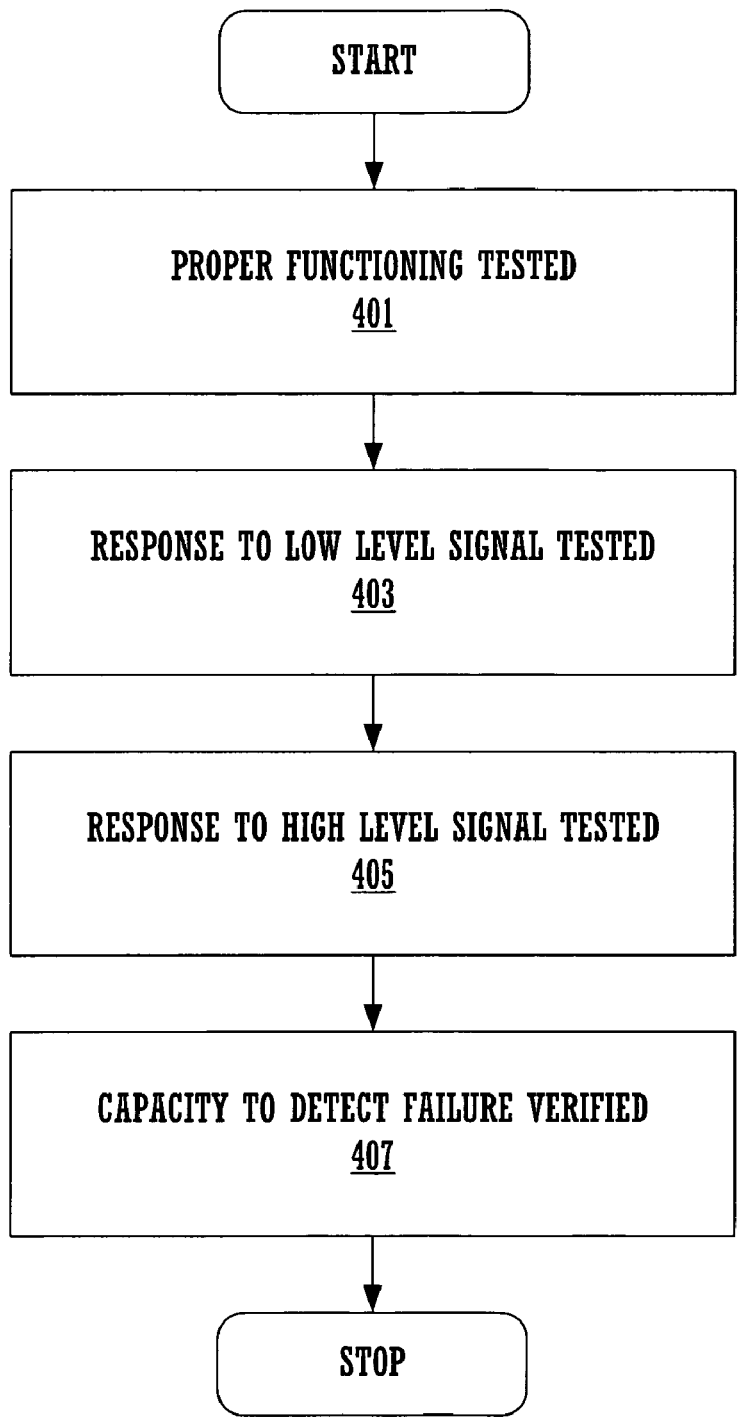
FIG. 4 is a flowchart of steps performed in testing switch functionality in switched capacitor arrays according to one embodiment of the present invention.

FIG. 4 is a flowchart of steps performed in testing switch functionality in switched capacitor arrays according to one embodiment of the present invention. At step 401, the proper functioning of the testing circuit is tested. This test examines whether or not the test circuit switches are "stuck on" and causing an unintentional loading of the filter.

At step 403, the response of the capacitor array switch M0 to a low level control signal C<n> is tested. The purpose of the test is to verify that capacitor array switch M0 is "off" when the control signal C<n> is "low".

At step 405, the response of the capacitor array switch M0 to a high level control signal C<n> is tested. The purpose of the test is to verify that capacitor array switch M0 is "on" when the control signal C<n> is "high".

At step 407, the capacity of the test circuit to detect circuit failure is verified. This test examines whether or not the test output bit is stuck "high".

Testing the Functionality of the Test Circuit

Figure 5A:
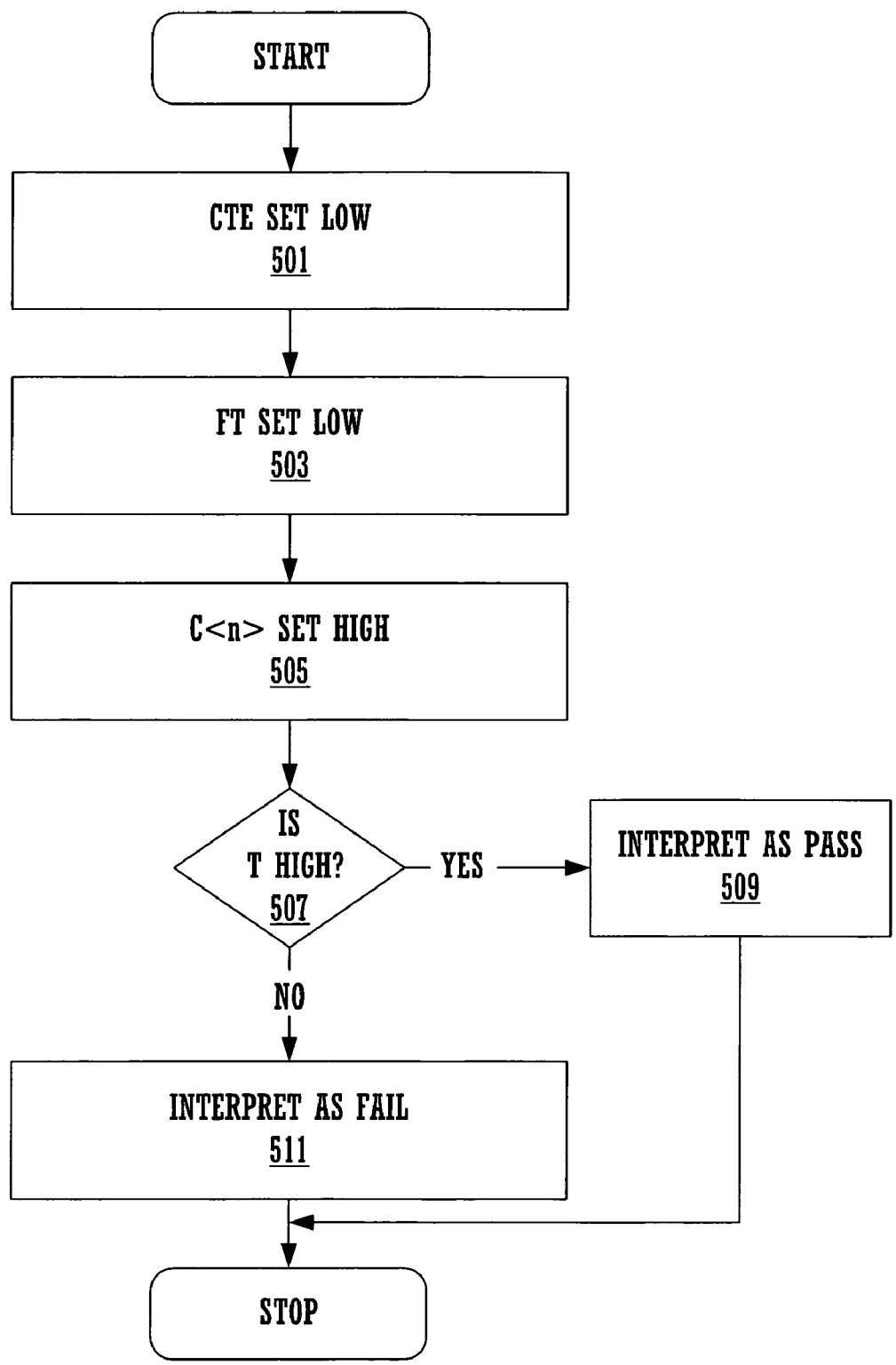
FIG. 5A is a flowchart of operations performed in testing the functionality of a BIT circuit according to one embodiment of the present invention.

FIG. 5A is a flowchart of computer controlled operations performed in testing the functionality of a BIT circuit (e.g., 303) according to one embodiment of the present invention. This test is intended to ensure that the test circuit switches are not "stuck on" (improperly activated or closed) and causing an unintentional loading of the filter. Referring to FIG. 5A, at step 501, capacitor test enable CTE is set "low" to deactivate the test enable switch MB1. At step 503, the fault type select signal FT is set "low" to activate the weak pullup current source MB2 and the strong pulldown current source MO3. At step 505, capacitor control bit C<n> is set "high" so as to activate capacitor array switch M0. When the fault type select bit FT is set "low", the weak pullup current source MB2 pulls the internal node T "high", and the strong pulldown current source MO3 in the operational amplifier circuit 301 pulls the Cin node "low". However, if the switch that is under test, MB1 (e.g. the test enable switch), is functioning properly for this particular test, it should be deactivated (e.g. "off" or open) thus allowing internal node T to remain "high" under the influence of weak pullup current source MB2. Consequently, if at step 507, internal node T is determined to be "high", this result may be interpreted as a test PASS.

At step 509, the "high" signal level present at internal node T corresponding to a test Pass is transmitted to the capacitor test output terminal CTO via buffer 305 as a single digital bit indicating that the proper function of capacitor test enable switch MB1 has been effectuated.

However, if test enable switch MB1 is "stuck on" (improperly activated or closed), the strong pulldown current source MO3 will over power the weak pull up current source MB2, and the internal node T will be pulled low under its influence. Consequently, because test enable switch MB1 should be deactivated for this particular test, a determination that internal node T is "low" at step 507, may be interpreted as a test FAIL.

At step 511, the low signal level present at internal node T corresponding to a test Fail is transmitted to the capacitor test output CTO via buffer 205 as a single digital bit indicating the improper functioning of the capacitor test enable switch MB1.

FIG. 5B show charts 500A and 500B displaying test results corresponding to a particular switch disposition in a circuit configured in accordance with the process of FIG. 5A. The charts of FIG. 5B show that when capacitor test enable CTE and fault type select FT are set "low", capacitor control bit C<n> is set "high" (see chart 500A), and test enable switch MB1 is "off", a passage of the test may be indicated (see chart 500B). However, if test enable switch MB1 is "on", then a test failure may be indicated (see chart 500B).

Testing that Capacitor Array Switch is Off

Figure 6A:
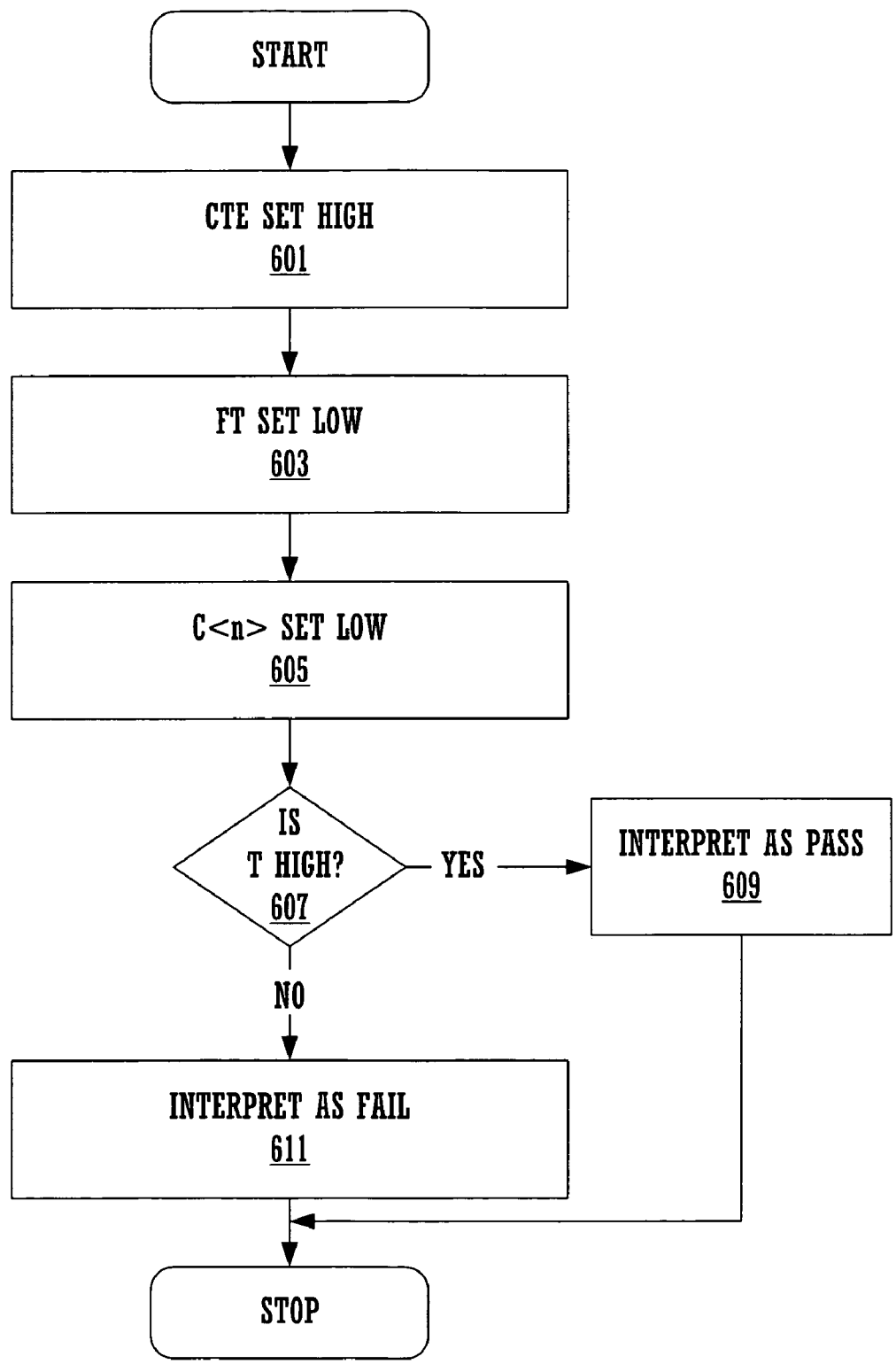
FIG. 6A is a flowchart that shows steps performed in examining whether a switch under test is turned off according to one embodiment of the present invention.

FIG. 6A is a flowchart that shows computer controlled steps performed in testing whether a switch under test is turned off, according to one embodiment of the present invention. This test is intended to test the control circuitry and capacitor array switch M0 to ensure that it is "off" when the control signal C<n> is "low". Referring to FIG. 6A, at step 601, capacitor test enable CTE is set "high" to activate the test enable switch MB1. At step 603, the fault type select signal FT is set "low" in order to activate the weak pullup current source MB2 and the strong pulldown current source MO3. At step 605, capacitor control bit C<n> is set "low" so as to deactivate capacitor array switch M0. When the fault type select bit FT is set "low" the weak pullup current source MB2 pulls the T node "high", and the strong pulldown current source MO3 in operational amplifier circuit 301 pulls the Cin node "low". However, if the switch that is under test, M0, is functioning properly for this particular test it should be deactivated (e.g. "off" or open) and the capacitor should be a DC open. Thus, internal node T remains HIGH under the influence of weak pullup current source MB2. Consequently, if at step 607, internal node T is determined to be "high", this result may be interpreted as a test PASS.

At step 609, the "high" signal level present at internal node T corresponding to a test PASS is transmitted to the capacitor test output CTO via buffer 205 as a single digital bit indicating that the proper function of capacitor test enable switch M0 has been effectuated.

However, if M0 is "stuck on" (improperly activated or closed), or the capacitor terminals are shorted, the strong pulldown current source MO3 will over power the weak pull up current source MB2, and the internal node T will be pulled low under its influence. Consequently, because M0 should be deactivated for this particular test, a determination that the internal node T is "low" at step 607, may be interpreted as a test FAIL.

At step 611, the "low" signal level present at internal node T corresponding to a test FAIL is transmitted to the capacitor test output CTO via buffer 205 as a single digital bit indicating the improper functioning of the capacitor array switch M0.

FIG. 6B shows charts 600A and 600B displaying test results corresponding to a particular switch disposition in a circuit configured in accordance with the process of FIG. 6A. The charts of FIG. 6B show that when capacitor test enable CTE is set "high", fault type select FT is set "low", capacitor control bit C<n> is set "low" (see chart 600A) and capacitor array switch M0 is "off" a passage of the test is indicated (see chart 600B). However, if capacitor array switch M0 is "on", then a test failure may be indicated (see chart 600B).

Testing that Capacitor Array Switch is On

Figure 7A:
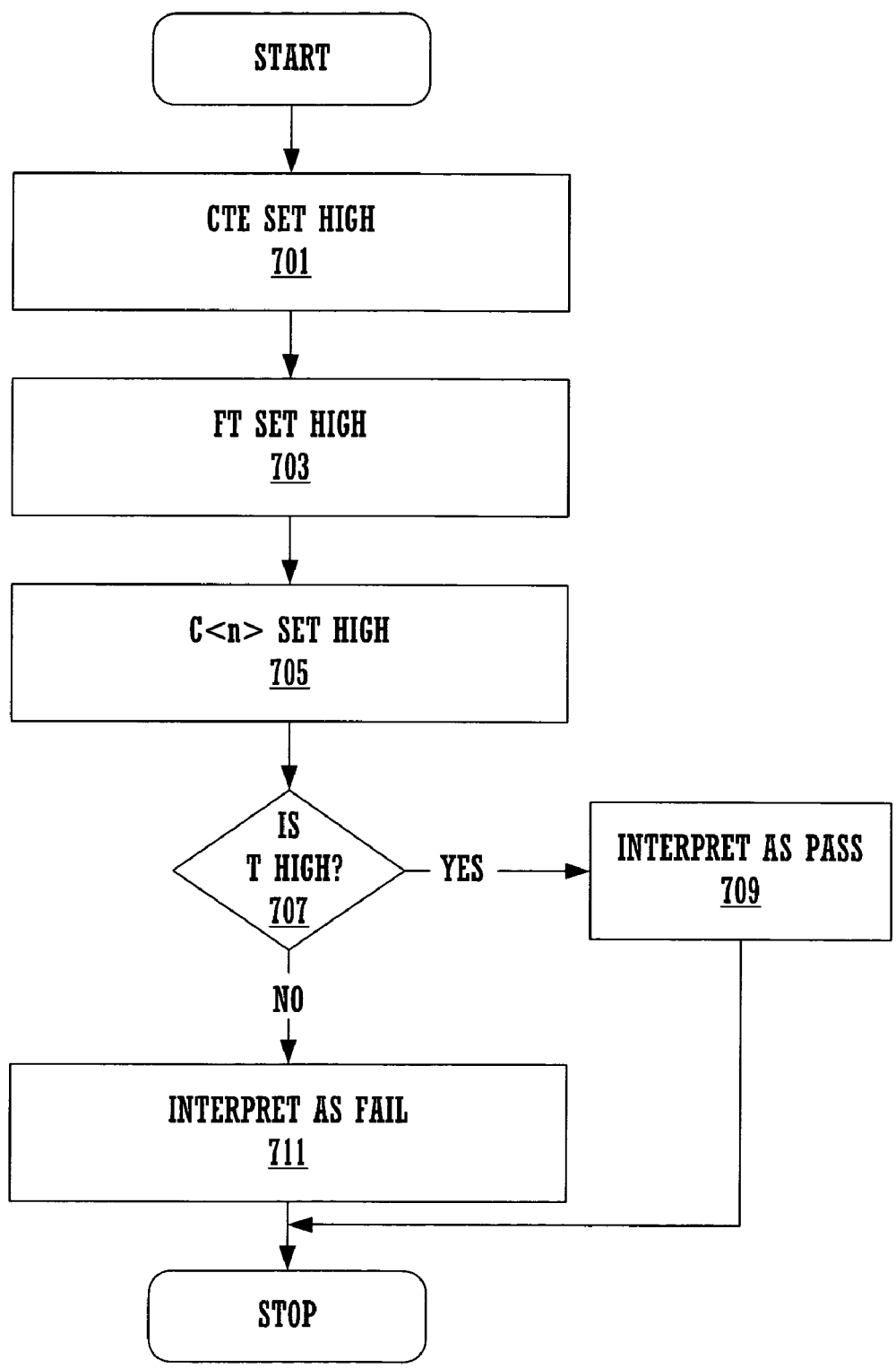
FIG. 7A is a flowchart that shows the steps performed to verify that capacitor array switch is activated when the control signal is high according to one embodiment of the present invention.

FIG. 7A is a flowchart that shows the computer controlled steps performed to test whether capacitor array switch is activated when the control signal C<n> is "high" according to one embodiment of the present invention. Referring to FIG. 7A, at step 701, capacitor test enable CTE is set "high" to activate the test enable switch MB1. At step 703, the fault type select signal FT is set "high" to activate the weak pulldown current source MB3 and the strong pullup current source MO2. At step 705, capacitor control bit C<n> is set "high" so as to activate capacitor array switch M0. When the fault type select bit FT is set "high" the weak pulldown current source MB3 pulls the internal node T "low" and the strong pullup current source MO2 in operational amplifier circuit 301 pulls the Cin node "high". However, if the switch that is under test (e.g., capacitor array switch M0), is functioning properly for this particular test it should be activated (e.g. "on" or closed). If such is the case, internal node T remains "high" under the supervening influence of strong pullup current source MO2. Consequently, if at step 707, internal node T is determined to be "high", this result may be interpreted as a test PASS.

At step 709, the "high" signal level present at internal node T corresponding to a test Pass is transmitted to the capacitor test output CTO via buffer 205 as a single digital bit indicating that the proper function of capacitor test enable switch M0 has been effectuated.

However, if M0 is stuck off (improperly deactivated or open), the strong pullup current MO2 will be disconnected from node T, and the internal node T will be pulled "low" under the influence of weak pulldown current source MB3. Consequently, because M0 should be activated and facilitating the pulling up of internal node T for this particular test, a determination that the internal node T is "low" at step 707, may be interpreted as a test FAIL.

At step 711, the "low" signal level present at internal node T corresponding to a test Fail is transmitted to the capacitor test output CTO via buffer 305 as a single digital bit indicating the improper functioning of the capacitor array switch M0.

FIG. 7B show charts 700A and 700B displaying test results corresponding to a particular switch disposition in a circuit configured in accordance with the process of FIG. 7A. The charts of FIG. 7B show that when capacitor enable switch CTE is set "high", fault type select FT is set "high", capacitor control bit C<n> is set "high" (see chart 700A) and capacitor array switch M0 is "on", a passage of the test may be indicated (see chart 700B). However, if capacitor array switch M0 is "off", then a test failure may be indicated (see chart 700B).

Testing Test Circuitry Failure Detection

Figure 8A:
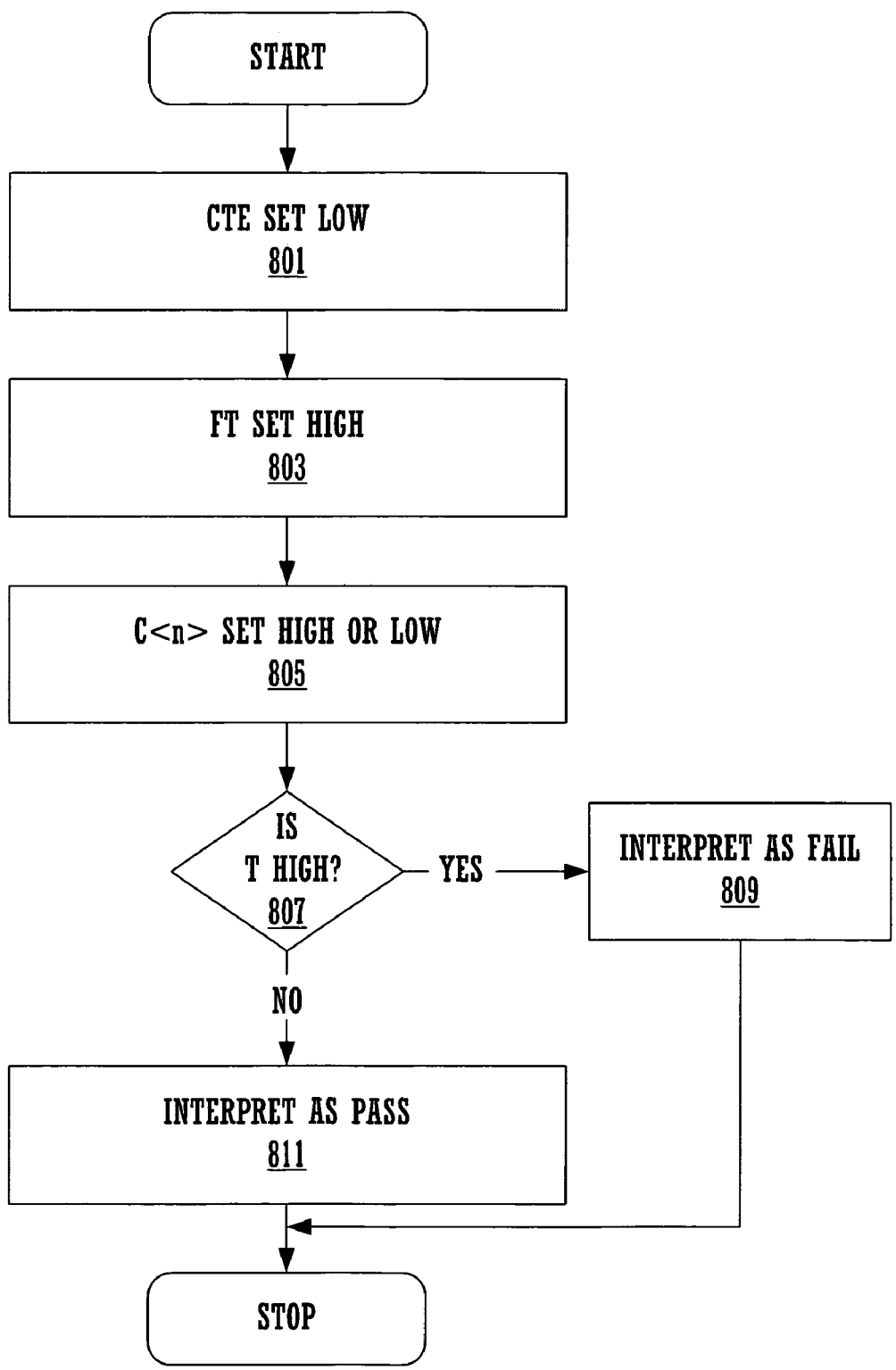
FIG. 8A is a flowchart of the steps performed in a test to ensure that test circuitry will detect failure and that an output bit is not stuck high according to one embodiment of the present invention.

FIG. 8A is a flowchart of the computer controlled steps performed in a test to ensure that test circuitry will detect a failure and that an output bit is not stuck high according to one embodiment of the present invention. Referring to FIG. 208A, at step 801, capacitor test enable CTE is set "low" to deactivate the test enable switch MB1. At step 803, the fault type select signal FT is set "high" to activate the weak pulldown current source MB3 and the strong pullup current source MO2. At step 805, capacitor control bit C<n> is set (for this particular test its setting doesn't matter—it is a don't care). When the fault type select bit FT is set "high" the weak pulldown current source MB3 pulls the T node low and the strong pullup current source MO2 in operational amplifier circuit 301 pulls the Cin node "high". Because capacitor test enable switch MB1 is deactivated and strong pullup current source is disconnected from the internal node T, the weak pulldown current source will pull the node low, evidencing its capacity to register a "low" signal level. Consequently, if at step 807, internal node T is determined to be "low", this result may be interpreted as a test PASS.

At step 809, the "low" signal level present at internal node T corresponding to a test Pass is transmitted to the capacitor test output terminal CTO via buffer 205 as a single digital bit indicating that the proper function of the test circuit has been effectuated.

However, if capacitor test enable switch MB1 is "stuck on" (improperly activated or closed), the internal node T will be pulled high under the influence of strong pullup current source MO2. Consequently, because the capacitor test enable switch MB1 should be deactivated and the internal node T pulled low for this particular test, a determination that internal node T is high at step 807, may be interpreted as a test FAIL.

At step 811, the "low" signal level present at the internal node T and corresponding to a test Fail is transmitted to the capacitor test output terminal CTO via buffer 205 as a single digital bit indicating the improper functioning of the test circuitry.

FIG. 8B show charts 800A and 800B displaying test results corresponding to a particular switch disposition in a circuit configured in accordance with the process of FIG. 8A. The charts of FIG. 8B show that when capacitor test enable CTE is set "low", fault type select FT is set "high", capacitor control bit C<n> is a don't care (see chart 800A), and test enable switch MB1 is "off" a passage of the test may be indicated (see chart 800B). However, if test enable switch MB1 is "on", then a test failure may be indicated (see chart 800B).

Exemplary Hardware in Accordance with Embodiments of the Present Invention

Figure 9:
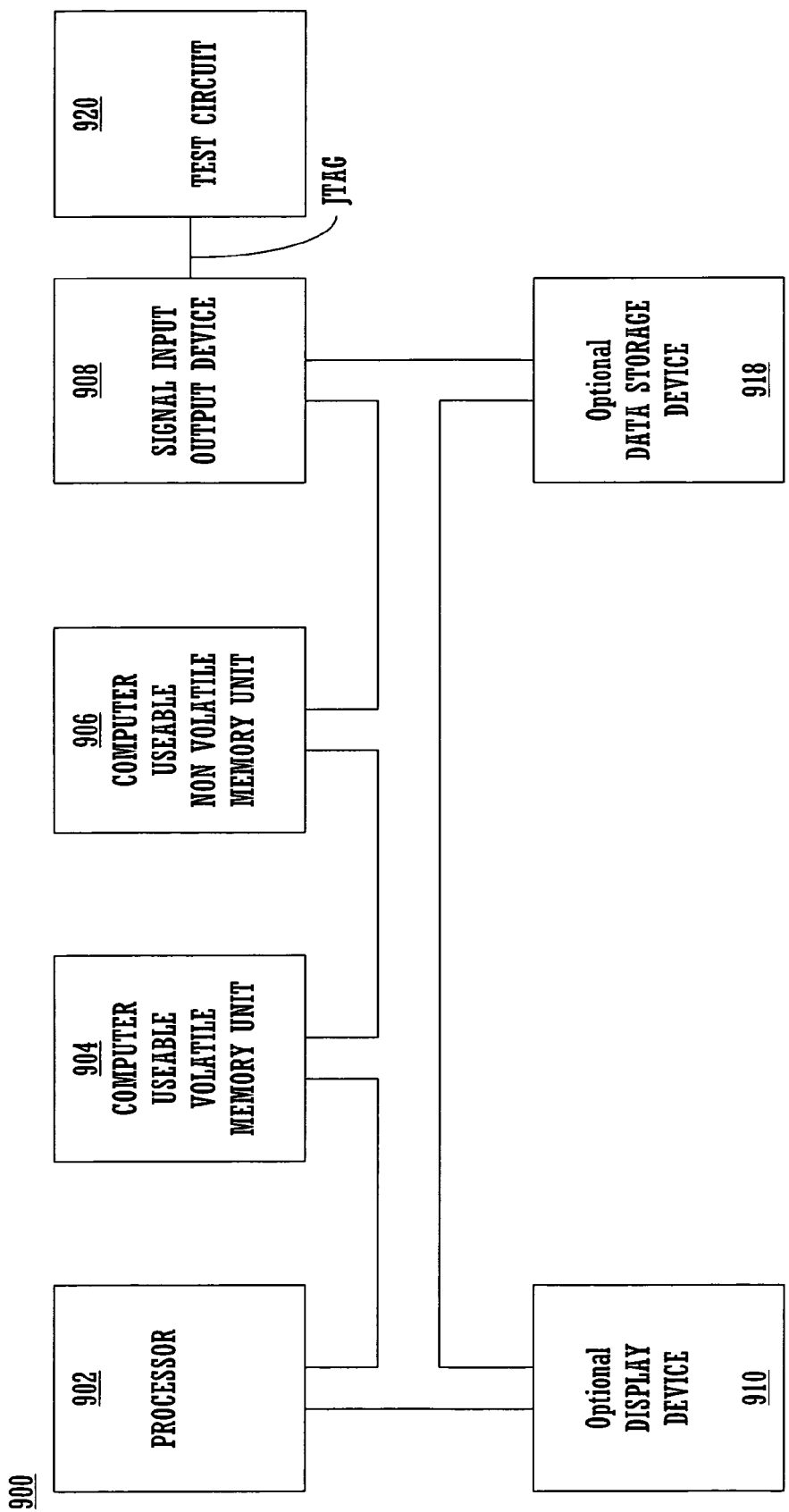
FIG. 9 is a block diagram of an embodiment of an exemplary computer system used in accordance with the one embodiment of present invention.

FIG. 9 is a block diagram of an embodiment of an exemplary computer system 900 used in accordance with the present invention. It should be appreciated that system 900 is not strictly limited to be a computer system. As such, system 900 of the present embodiment is well suited to be any type of computing device (e.g., server computer, portable computing device, etc.). Within the following discussions of the present invention, certain processes and steps are discussed that are realized, in one embodiment, as a series of instructions (e.g., software program) that reside within computer readable memory units of computer system 900 and executed by a processor(s) of system 900. When executed, the instructions cause computer 900 to perform specific actions and exhibit specific behavior which is described in detail below.

Computer system 900 of FIG. 9 comprises an address/data bus 910 for communicating information, one or more central processors 902 coupled with bus 910 for processing information and instructions. Central processor unit 902 may be a microprocessor or any other type of processor. The computer 900 also includes data storage features such as a computer usable volatile memory unit 904 (e.g., random access memory, static RAM, dynamic RAM, etc.) coupled with bus 910 for storing information and instructions for central processor(s) 902, a computer usable non-volatile memory unit 806 (e.g., read only memory, programmable ROM, flash memory, EPROM, EEPROM, etc.) coupled with bus 910 for storing static information and instructions for processor(s) 902. System 900 also includes one or more signal generating and receiving devices 908 coupled with bus 910 for enabling system 900 to interface with other electronic devices. The communication interface(s) 908 of the present embodiment may include wired and/or wireless communication technology. For example, in one embodiment of the present invention, the communication interface 908 is a serial communication port, but could also alternatively be any of a number of well known communication standards and protocols, e.g., Universal Serial Bus (USB), Ethernet, FireWire (IEEE 1394), parallel, small computer system interface (SCSI), infrared (IR) communication, Bluetooth wireless communication, broadband, and the like.

According to one embodiment of the present invention, computer system 900 may configure a test circuit 920 (see FIG. 3A and corresponding discussion for details) for testing and thereafter interpret the resulting circuit response. According to such embodiments, computer system 900 may communicate the commands related to test circuit configuration (test mode), and receive the data regarding the circuits response via a JTAG port (see FIG. 9). In other embodiments, other types of port structures may be employed.

Optionally, computer system 900 can include an alphanumeric input device 914 including alphanumeric and function keys coupled to the bus 910 for communicating information and command selections to the central processor(s) 902. The computer 900 can include an optional cursor control or cursor directing device 916 coupled to the bus 910 for communicating user input information and command selections to the central processor(s) 902. The system 900 can also include a computer usable mass data storage device 918 such as a magnetic or optical disk and disk drive (e.g., hard drive or floppy diskette) coupled with bus 910 for storing information and instructions. An optional display device 912 is coupled to bus 910 of system 900 for displaying video and/or graphics.

As noted above with reference to exemplary embodiments thereof, the present invention provides for switching a capacitor switch of a switch capacitor array between on and off, switching a test enable switch of a BIT circuit between on and off, pulling an internal node of the BIT circuit either high or low using a current source, and determining whether the internal node has been pulled either high or low. In addition, the method and system provides for making a pass or fail determination based on the determined state of the internal node.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of testing switch functionality of a tunable capacitor array and capacitor integrity comprising:
   switching a capacitor switch of said tunable capacitor array between on and off;
   switching a test enable switch of a built in testing (BIT) circuit between on and off;
   pulling an internal node of said BIT circuit either high or low using a current source;
   determining whether said internal node has been pulled either high or low; and
   making a pass or fail determination of said switch functionality of said tunable capacitor array based on a determined state of said internal node.

2. The method of claim 1, wherein said current source is a pullup current source or a pulldown current source and said pullup current source or said pulldown current source is either strong or weak.

3. The method of claim 2, wherein a weak pullup current source or a weak pulldown current source are integrated within a BIT circuit or an operational amplifier circuit, and a strong pullup current source or a strong pulldown current source are integrated within a BIT circuit or an operational amplifier circuit.

4. The method of claim 1, wherein said pulling said internal node either high or low using a current source is performed on a node in the BIT circuit.

5. The method of claim 1, wherein the method further comprises:
   testing whether said BIT circuitry is functional;
   testing whether said test enable switch is turned off;
   testing whether said capacitor switch is turned on; and
   testing whether said test circuitry will detect failure.

6. The method of claim 5, wherein the method further comprises testing whether or not a capacitor in said switch capacitor array is shorted.

7. A computer useable medium having computer useable code embodied therein for causing a computer to perform operations comprising:
   switching a capacitor switch of a switch capacitor array between on and off;
   switching a test enable switch of a built in testing (BIT) circuit between on and off;
   pulling an internal node of said BIT circuit either high or low using a current source;
   determining whether said internal node has been pulled either high or low; and
   making a pass or fail determination of said switch functionality of said switch capacitor array based on a determined state of the internal node.

8. The method of claim 7, wherein said current source is a pullup current source or a pulldown current source and said pullup current source or said pulldown current source is either strong or weak.

9. The method of claim 8, wherein a weak pullup current source or a weak pulldown current source are integrated within a BIT circuit or an operational amplifier circuit, and a strong pullup current source or a strong pulldown current source are integrated within a BIT circuit or an operational amplifier circuit.

10. The method of claim 7, wherein said pulling an internal node either high or low using a current source is performed on a node in the BIT circuit.

11. The method of claim 7, wherein the method further comprises:
    testing whether said BIT circuitry is functional;
    testing whether said test enable switch is turned off;
    testing whether said capacitor switch is turned on; and
    testing whether said test circuitry will detect failure.

12. The method of claim 11, wherein the method further comprises testing whether or not a capacitor in said switch capacitor array is shorted.

13. A circuit system for testing the switch functionality of a tunable capacitor array and capacitor integrity comprising:
    a tunable capacitor array comprising a capacitor switch that is switched between on and off;
    a built in testing (BIT) circuit comprising a test enable switch that is switched between on and off; and
    a current source for pulling an internal node of said BIT circuit either high or low using a current source,
    wherein a pass or fail determination of said switch functionality of said tunable capacitor array is made based on whether an internal node of said BIT circuit has been pulled either high or low.

14. The circuit system of claim 13, wherein said current source is a pullup current source or a pulldown current source and said pullup current source or said pulldown current source is either strong or weak.

15. The circuit system of claim 13, wherein a weak pullup current source or a weak pulldown current source are integrated within said BIT circuit or an operational amplifier circuit, and a strong pullup current source or a strong pulldown current source are integrated within said BIT circuit or an operational amplifier circuit.

16. The circuit system of claim 13, wherein said circuit system comprises test circuitry that includes a plurality of built-in test (BIT) circuits, each BIT circuit for testing a corresponding capacitor switch of said plurality of capacitor switches and for generating a digital test result thereof.

17. The circuit system of claim 13, wherein each BIT circuit comprises:
    a weak pull up current source;
    a weak pull down current source coupled to said weak pull up current source;
    a test enable switch comprising: a first end coupled to said weak pull up and weak pull down current sources; and a second end coupled to a first end of a corresponding capacitor switch.

18. The circuit system of claim 17, wherein said weak pull up current source and said weak pull down current sources are controlled, respectively, by a test signal and an inverted test signal.

19. The circuit system of claim 17 wherein the digital state of a first end of said test enable switch is made available externally for testing purposes.

20. The circuit system of claim 13 further comprising:
    a strong pull up current source; and
    a strong pull down current source coupled to said strong pull up current source and also coupled to a second end of said corresponding capacitor switch.

21. The circuit system of claim 20, wherein said strong pull up current source and said strong pull down current sources are controlled, respectively, by said test signal and said inverted test signal.

22. The circuit system of claim 13 wherein a first end of said capacitor switch is coupled to a corresponding capacitor of a plurality of capacitors.

* * * * *